(12) United States Patent
Riegel et al.

(10) Patent No.: US 9,755,173 B2
(45) Date of Patent: Sep. 5, 2017

(54) OPTOELECTRONIC COMPONENT, METHOD FOR PRODUCING AN OPTOELECTRONIC COMPONENT

(71) Applicant: OSRAM OLED GmbH, Regensburg (DE)

(72) Inventors: Nina Riegel, Tegernheim (DE); Carola Diez, Regensburg (DE); Andreas Rausch, Regensburg (DE); Dominik Pentlehner, Regensburg (DE); Georg Dirscherl, Tegernheim (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/712,972

(22) Filed: May 15, 2015

(65) Prior Publication Data

US 2015/0333109 A1    Nov. 19, 2015

(30) Foreign Application Priority Data

May 16, 2014  (DE) .................. 10 2014 106 952

(51) Int. Cl.
*H01L 51/50* (2006.01)
*H01L 27/32* (2006.01)
(Continued)

(52) U.S. Cl.
CPC .......... *H01L 51/5036* (2013.01); *C09K 11/06* (2013.01); *H01L 27/3232* (2013.01);
(Continued)

(58) Field of Classification Search
CPC ............. H01L 51/5036; H01L 51/5271; H01L 51/5262; H01L 51/5268; H01L 27/322
See application file for complete search history.

(56) References Cited

U.S. PATENT DOCUMENTS 6,731,359 B1 * 5/2004 Fukaya ................. G02B 5/201
349/106
2004/0242115 A1 * 12/2004 Yanagawa ............ H01L 27/322
445/25
(Continued)

FOREIGN PATENT DOCUMENTS

DE    102004010000 A1    9/2004
DE    10393384 T5    6/2006
(Continued)

OTHER PUBLICATIONS

Friedrich-Schiller-Universitaet Jena; "Neue Hoffnung für Warzenpatienten" (Dec. 17, 2002)—http://www.uni-protokolle.de/nachrichten/id/10755/; retrieved via web.archive.org for Apr. 15, 2011; 2 pages.
(Continued)

*Primary Examiner* — Michael Jung
*Assistant Examiner* — Mikka Liu
(74) *Attorney, Agent, or Firm* — Viering, Jentschura & Partner mbB

(57) ABSTRACT

An optoelectronic component is provided. The optoelectronic component includes an electromagnetic radiation source including an optically active region designed for emitting a first electromagnetic radiation, and a converter structure, which includes at least one converter material and is arranged in the beam path of the first electromagnetic radiation. The at least one converter material is designed to convert at least one portion of the first electromagnetic radiation into at least one second electromagnetic radiation. The at least one second electromagnetic radiation has at least one different wavelength than the at least one portion of the first electromagnetic radiation. The converter structure is formed in a structured fashion in such a way that the converter structure has a predefined region, such that the at least one second electromagnetic radiation is emittable only
(Continued)

from the predefined region. The predefined region has a smaller area than the optically active region.

9 Claims, 10 Drawing Sheets

(51) Int. Cl.
    *H01L 51/52* (2006.01)
    *H01L 51/56* (2006.01)
    *C09K 11/06* (2006.01)

(52) U.S. Cl.
    CPC ...... *H01L 51/5237* (2013.01); *H01L 51/5262* (2013.01); *H01L 51/5268* (2013.01); *H01L 51/5271* (2013.01); *H01L 51/56* (2013.01); *H01L 27/322* (2013.01); *H01L 2251/5361* (2013.01)

(56) References Cited

U.S. PATENT DOCUMENTS

| | | | |
|---|---|---|---|
| 2006/0202613 | A1 | 9/2006 | Kawaguchi et al. |
| 2009/0093761 | A1* | 4/2009 | Sliwa ................ A61B 17/3403 604/116 |
| 2011/0155296 | A1* | 6/2011 | Nakamura ............. G02B 5/201 156/67 |
| 2011/0284494 | A1 | 11/2011 | Von Malm |
| 2012/0299045 | A1 | 11/2012 | Pan et al. |
| 2013/0303777 | A1* | 11/2013 | Okamoto .............. C07F 15/002 548/103 |
| 2014/0153280 | A1* | 6/2014 | Lee ......................... G02B 5/23 362/606 |
| 2014/0288351 | A1* | 9/2014 | Jones ...................... A61N 5/06 600/9 |

FOREIGN PATENT DOCUMENTS

| | | |
|---|---|---|
| DE | 102007053286 A1 | 4/2009 |
| GB | 2393912 A | 6/2003 |
| WO | 2011091946 A1 | 8/2011 |

OTHER PUBLICATIONS

Dr. Med. H. Bresser; "Wira Behandlung"—www.drbresser.de/behandlungsvertahren/wira; retrieved on May 28, 2015—1 page.
German Search Report based on Application No. 10 2014 106 952.8 (7 Pages) dated Mar. 9, 2015 (Reference Purpose Only).

* cited by examiner

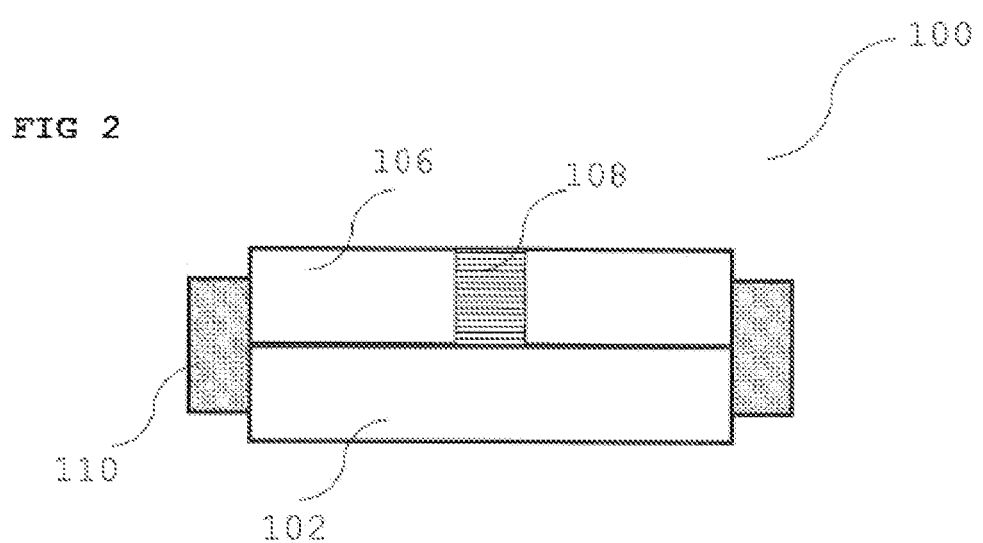

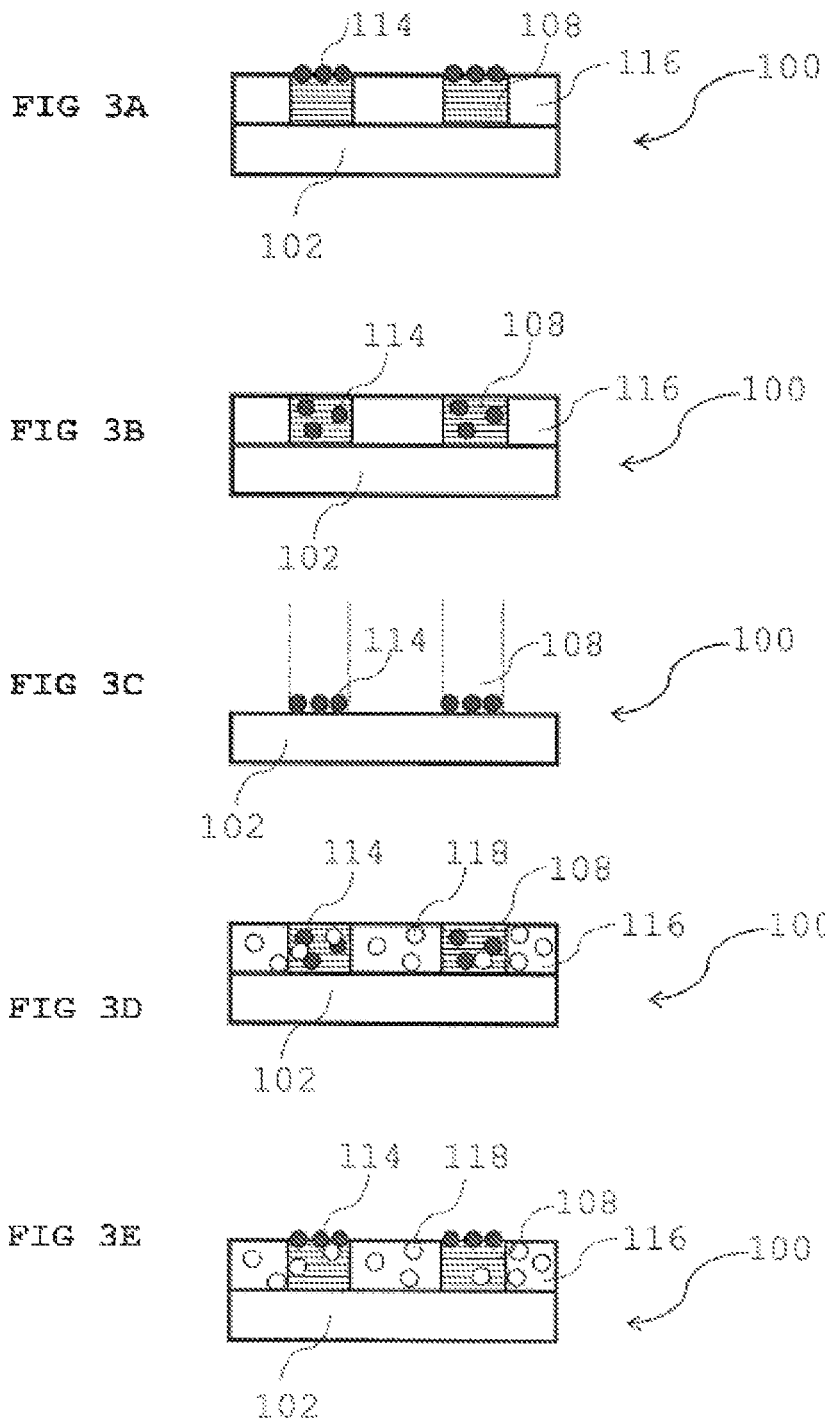

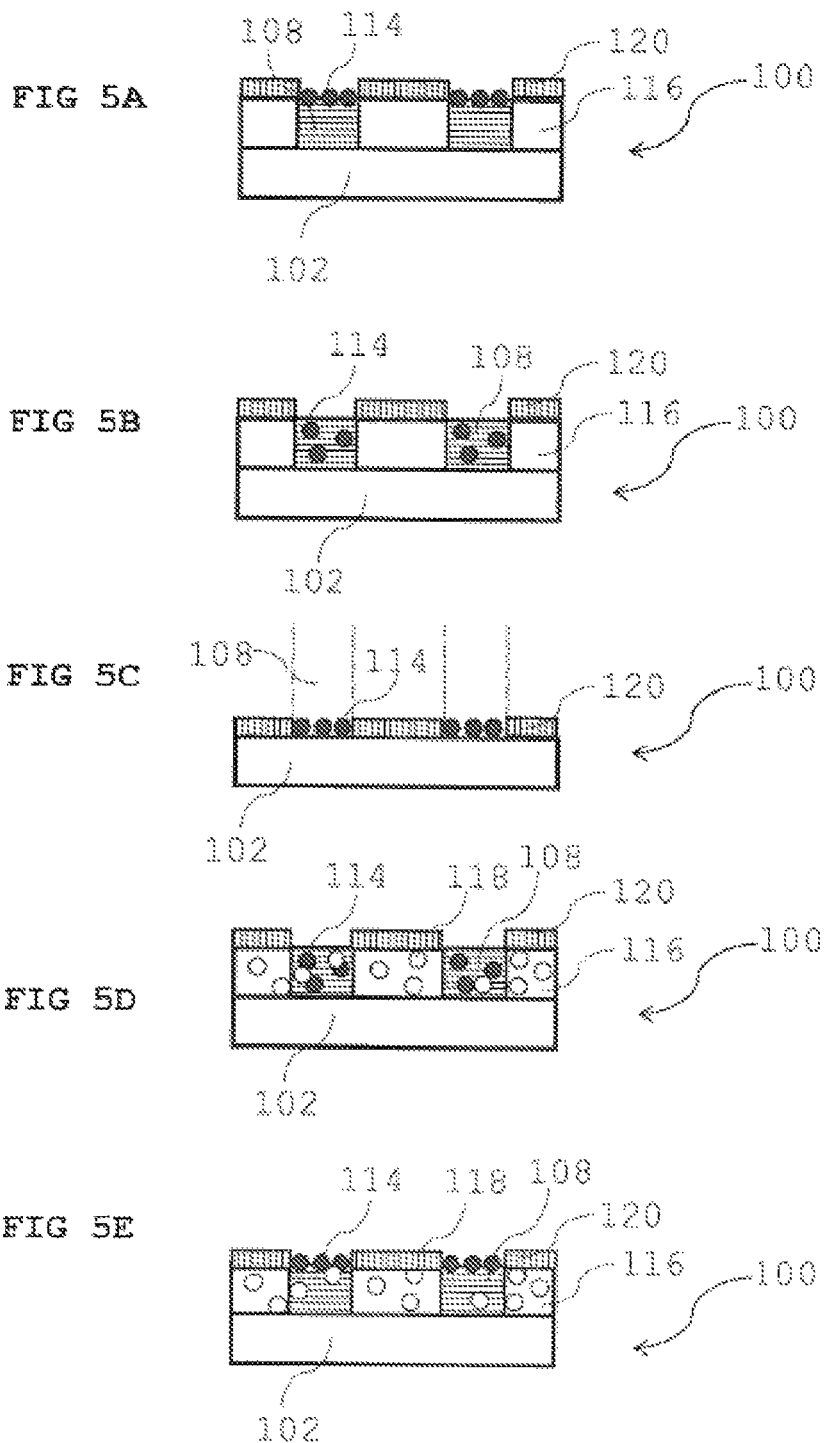

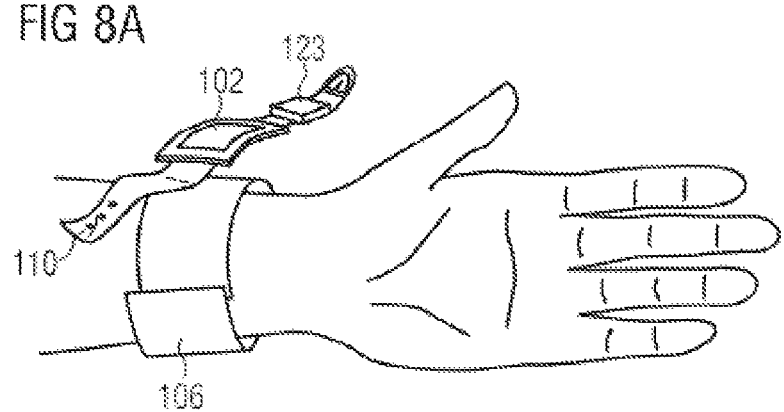
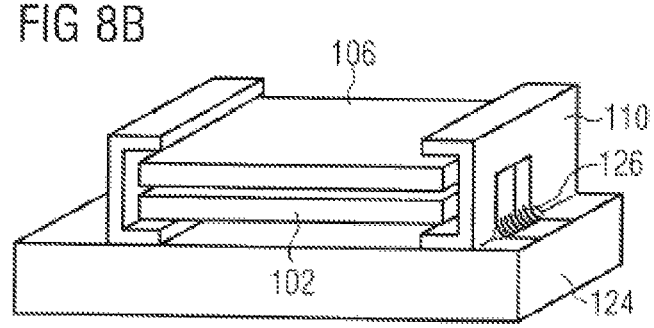
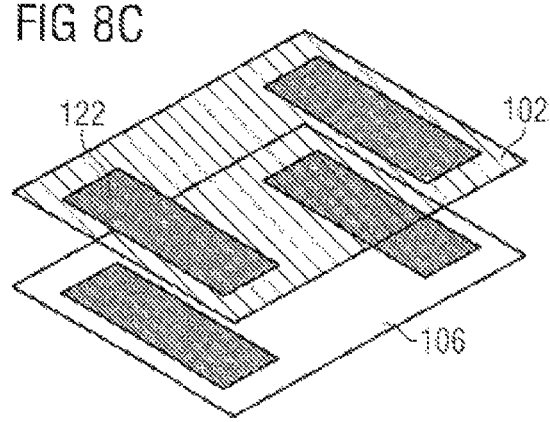

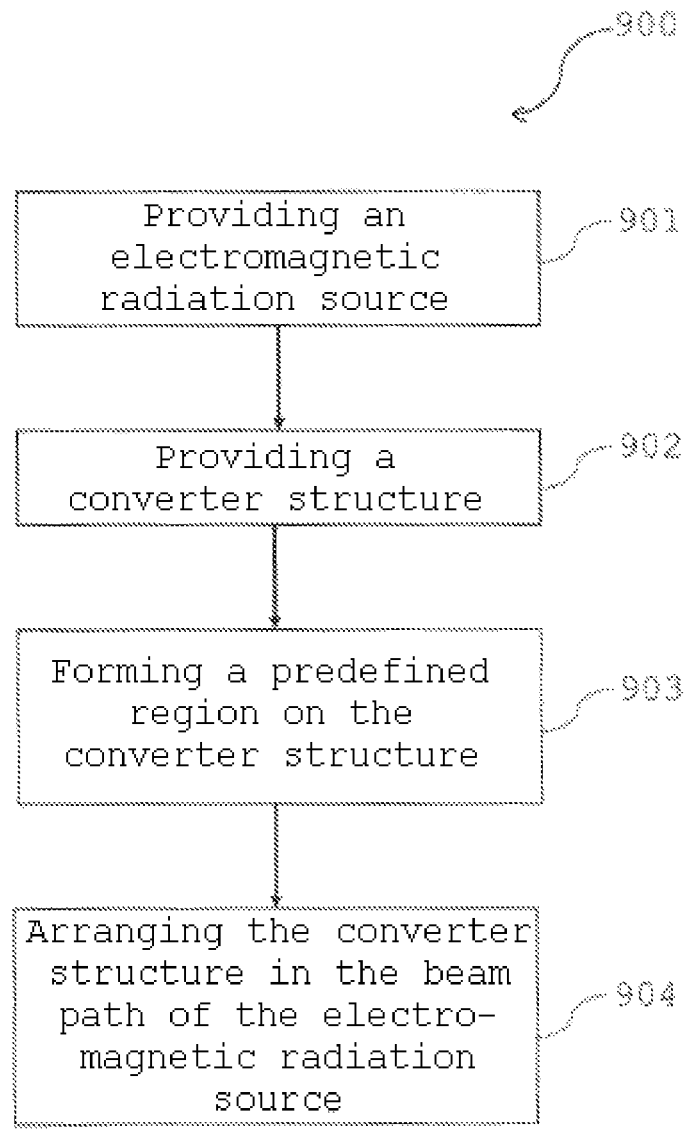

OPTOELECTRONIC COMPONENT, METHOD FOR PRODUCING AN OPTOELECTRONIC COMPONENT

CROSS-REFERENCE TO RELATED APPLICATION

This application claims priority to German Patent Application Serial No. 10 2014 106 952.8, which was filed May 16, 2014, and is incorporated herein by reference in its entirety.

TECHNICAL FIELD

Various embodiments relate generally to an optoelectronic component and a method for producing an optoelectronic component.

BACKGROUND

Infrared light (IR light), in particular near infrared (NIR), which is in a wavelength range of 0.78 μm to 3 μm, is used for therapeutic treatment in dermatology. The region of skin to be treated is usually irradiated areally. A local delimitation can be realized only in a complex fashion using conventional methods.

The use of OLEDs (OLED—organic light emitting diode) with IR emitters with individually adapted "perforated masks" in front of the OLED is expedient only to a limited extent in the case of IR emission, since most of the materials used for such a mask heat up and the local delimitation thus becomes indistinct. Moreover, the efficiency of OLED emitters generally decreases with increasing wavelength, that is to say that efficient IR OLEDs are difficult to produce. IR OLEDs exhibit higher self-heating than OLEDs which emit in the visible range of the electromagnetic spectrum (VIS), which is particularly disadvantageous for application in dermatology.

In medical technology, use is made of other IR sources, for example inorganic LEDs or IR lasers. The irradiation is locally delimited by in some instances complex optical systems. Hitherto, OLEDs have been adhesively bonded with conversion areas in a planar fashion, or a conversion layer has been applied directly to the substrate of the OLED, through which substrate the light is coupled out. In the case of contact methods, in medicine the high hygiene standards have to be taken into account. Materials are disposed of after contact with the patient.

SUMMARY

An optoelectronic component is provided. The optoelectronic component includes an electromagnetic radiation source including an optically active region designed for emitting a first electromagnetic radiation, and a converter structure, which includes at least one converter material and is arranged in the beam path of the first electromagnetic radiation. The at least one converter material is designed to convert at least one portion of the first electromagnetic radiation into at least one second electromagnetic radiation. The at least one second electromagnetic radiation has at least one different wavelength than the at least one portion of the first electromagnetic radiation. The converter structure is formed in a structured fashion in such a way that the converter structure has a predefined region, such that the at least one second electromagnetic radiation is emittable only from the predefined region. The predefined region has a smaller area than the optically active region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a schematic illustration of an optoelectronic component in accordance with various embodiments;

FIGS. 3A to 3E show schematic illustrations of various embodiments of an optoelectronic component;

FIGS. 5A to 5E show schematic illustrations of various embodiments of an optoelectronic component;

FIGS. 8A to 8C show schematic illustrations of various embodiments of an optoelectronic component;

FIG. 9 shows a schematic illustration of a method for producing an optoelectronic component in accordance with various embodiments.

DESCRIPTION

Figure 1A:
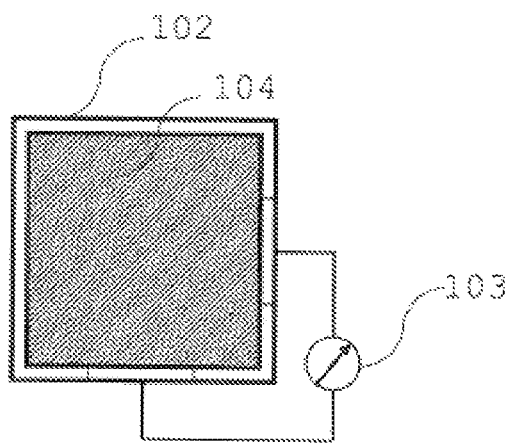
FIG. 1A shows a schematic illustration of an electromagnetic radiation source in accordance with various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In the following detailed description, reference is made to the accompanying drawings, which form part of the description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, electromagnetic radiation sources are described. An electromagnetic radiation source has an optically active region. The optically active region can emit electromagnetic radiation by a voltage applied to the optically active region. In various embodiments, the electromagnetic radiation source can be designed in such a way that the electromagnetic radiation has a wavelength range encompassing UV radiation (A-C), visible light and/or infrared radiation (A-C).

An electromagnetic radiation source can be formed for example as a light emitting diode (LED), as an organic light emitting diode (OLED), as a light emitting transistor and/or as an organic light emitting transistor, for example an organic field effect transistor (OFET). Furthermore, a plurality of electromagnetic radiation emitting components can be provided, for example in a manner accommodated in a common housing. The electromagnetic radiation source can have an organic functional layer system, which is synonymously also designated as organic functional layer structure. The organic functional layer structure may include or be formed from an organic substance or an organic substance mixture which is designed for example for emitting an electromagnetic radiation from an electric current provided, for example comprise an electroluminescent substance or an electroluminescent substance mixture in the current path.

An electromagnetic radiation source, for example an organic light emitting diode, for example also designated as pump OLED, can be designed as a so-called top emitter and/or a so-called bottom emitter. In the case of a bottom emitter, electromagnetic radiation is emitted from the electrically active region through the carrier. In the case of a top emitter, electromagnetic radiation is emitted from the top side of the electrically active region rather than through the carrier.

A top emitter and/or bottom emitter can also be designed as optically transparent or optically translucent, for example each of the layers or structures described below can be or be designed as transparent or translucent with respect to the emitted electromagnetic radiation.

An electromagnetic radiation source which provides electromagnetic radiation can be designed as a wired light emitting diode, surface mounted light emitting diode (surface mounted device—SMD) or chip-on-board light emitting diode (die).

A semiconductor chip which can provide electromagnetic radiation can be understood as an LED chip.

An electromagnetic radiation source can have for example a semiconductor chip which provides electromagnetic radiation (wired LED, SMD) or can be designed as a semiconductor chip which provides electromagnetic radiation (chip-on-board).

A wired light emitting diode can have a semiconductor chip which can provide electromagnetic radiation, for example an LED chip. The semiconductor chip can be encapsulated with a plastic cap, for example.

A chip-on-board light emitting diode can have an LED chip fixed on a substrate. The LED chip may have neither a housing nor contact pads.

The individual semiconductor chips can be applied or formed for example on a substrate, for example a printed circuit board.

In various embodiments, a planar electromagnetic radiation source has a first electrode, a second electrode and an organic functional layer structure, which can be formed in each case in a large-area fashion. As a result, the electromagnetic radiation source can have a continuous luminous area which is not structured into functional partial regions, for example a luminous area segmented into functional regions or around a luminous area which is formed by a multiplicity of pixels. A large-area emission of electromagnetic radiation from the electromagnetic radiation source can be made possible as a result. In this case, "large-area" can mean that the optically active side has an area, for example a continuous area, for example of greater than or equal to a few square millimeters, for example greater than or equal to one square centimeter, for example greater than or equal to one square decimeter. By way of example, the electromagnetic radiation source can have only a single continuous luminous area brought about by the large-area and continuous design of the electrodes and of the organic functional layer structure.

In various embodiments, a converter structure is designed for converting an electromagnetic radiation. The converter structure can also be designated as converter film or conversion area. The converter structure includes at least one phosphor. The converter structure can be arranged at a distance from the electromagnetic radiation source or be arranged directly on the electromagnetic radiation source. During the conversion, an excitation radiation is absorbed by a phosphor and converted into conversion radiation, the wavelength and thus spectral properties and/or color of which are determined by the conversion properties of the phosphor. By way of example, in the case of down-conversion, the excitation radiation of the electromagnetic radiation source is converted by the irradiated phosphor into conversion radiation having longer wavelengths than those of the excitation radiation. By way of example, blue excitation radiation can thus be converted into red or green conversion radiation with the aid of the conversion element. Up-conversion is also known, in the case of which the excitation radiation of the electromagnetic radiation source is converted by the irradiated phosphor into conversion radiation having shorter wavelengths than those of the excitation radiation.

The excitation radiation can also be designated as first electromagnetic radiation and the conversion radiation can also be designated as at least one second electromagnetic radiation.

A phosphor can also be designated as converter material, converter and/or conversion material. In various embodiments, the converter structure may include or be formed from one or a plurality of phosphor/s. The at least one phosphor is energetically excited by at least one portion of the electromagnetic radiation. Upon the subsequent energetic deexcitation, the phosphors emit an electromagnetic radiation of one or a plurality of predefined wavelength spectra, for example light colors. A conversion of the electromagnetic radiation thus takes place. During the conversion, the wavelengths of the absorbed portion of the electromagnetic radiation are shifted to shorter or longer wavelengths. The light colors can be individual colors or mixed colors. The individual colors may include for example green, red or yellow light and/or the mixed colors can be mixed for example from green, red and/or yellow light and/or include white light, for example. The formation of electromagnetic radiation having a second wavelength from electromagnetic radiation having a first wavelength is called wavelength conversion. Wavelength conversion is used in lighting devices for color conversion, for example for simplifying the generation of white light. In this case, by way of example, a blue light is converted into a yellow light. The color mixing of blue light and yellow light forms white light. The phosphor is thus a substance which converts in a lossy fashion electromagnetic radiation of one wavelength into electromagnetic radiation of a different wavelength, for example longer wavelength (Stokes shift) or shorter wavelength (anti-Stokes shift), for example by phosphorescence or fluorescence. The at least one phosphor can be or include for example a substance from the following substances: garnets, nitrides, silicates, oxides, phosphates, borates, oxynitrides, sulfides, selenides, aluminates, tungstates, and halides of aluminum, silicon, magnesium, calcium, barium, strontium, zinc, cadmium, manganese, indium, tungsten, and other transition metals or rare earth metals such as yttrium, gadolinium or lanthanum, which are doped with an activator such as, for example, copper, silver, aluminum, manganese, zinc, tin, lead, cerium, terbium, titanium, antimony or europium. In various embodiments, the phosphor may include or be formed from an oxidic or (oxy)nitridic phosphor such as a garnet, orthosilicate, nitrido(alumo) silicate, nitride or nitridoorthosilicate, or a halide or halophosphate, for example $Ce^{3+}$ doped garnets such as YAG:Ce and LuAG, for example $(Y,Lu)_3(Al,Ga)_5O_{12}:Ce^{3+}$; $Eu^{2+}$ doped nitrides, for example $CaAlSiN_3:Eu^{2+}$, $(Ba,Sr)_2Si_5N_8:Eu^{2+}$; $Eu^{2+}$ doped sulfides, SIONs, SiAlON, orthosilicates, for example $(Ba,Sr)_2SiO_4:Eu^{2+}$; chlorosilicates, chlorophosphates and/or BAM (barium magnesium aluminate:Eu). Specific examples of suitable phosphors are strontium chloroapatite:Eu $((Sr,Ca)_5(PO_4)_3Cl:Eu$; SCAP), yttrium aluminum garnet:cerium (YAG:Ce) or $CaAlSiN_3:Eu$. Furthermore, the phosphor or phosphor mixture can contain for example particles having light scattering properties and/or auxiliary substances. Examples of auxiliary substances include surfactants and organic solvents. Examples of light scattering particles are gold, silver and metal oxide particles.

In various embodiments, the term "translucent" or "translucent layer" can be understood to mean that a layer or a material is transmissive to light, for example to the light generated by the electromagnetic radiation source, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example a layer), wherein part of the light can be scattered in this case.

In various embodiments, the term "transparent" or "transparent layer" can be understood to mean that a layer is transmissive to light (for example at least in a partial range of the wavelength range of from 380 nm to 780 nm), wherein light coupled into a structure (for example a layer) is also coupled out from the structure (for example layer) without scattering or light conversion.

The connection of a first body to a second body can be positively locking, force-locking and/or cohesive. The connections can be embodied as releasable, i.e. reversible. In various embodiments, a reversible, close connection can be realized for example as a screw connection, a clamping, a latching connection and/or by clips and/or holding pins. However, the connections can also be embodied as non-releasable, i.e. irreversible. In this case, a non-releasable connection can be separated only by the connection means being destroyed. In various embodiments, an irreversible, close connection can be realized for example as a riveted connection, an adhesively bonded connection or a soldered connection.

In the case of a positively locking connection, the movement of the first body can be restricted by a surface of the second body, wherein the first body moves perpendicularly, i.e. normally, in the direction of the restricting surface of the second body. In other words, in the case of a positively locking connection, a relative movement of the two bodies is prevented on account of their mutually corresponding shape in at least one direction. A hook in an eye can be restricted in movement for example in at least one spatial direction. In various embodiments, a positively locking connection can be realized for example as a screw connection, a hook and loop fastener, a clamping, a latching connection and/or by clips. Furthermore, a positively locking connection can be formed by an interference fit of a first body with respect to a second body. By way of example, an end section of a holding pin which is led through a holding cutout can be deformed in such a way that its cross section is larger than the holding cutout and it can no longer be led back through the holding cutout.

In the case of a force-locking connection, on account of a physical contact of the two bodies under pressure, a static friction can restrict a movement of the first body parallel to the second body. One example of a force-locking connection may be, for example, a bottle cork in a bottle neck or a dowel with an interference fit in a corresponding dowel hole. Furthermore, the force-locking connection can be formed by a press fit between a first body and a second body. By way of example, a diameter of the holding pin can be chosen such that it can still just be inserted into the holding cutout with deformation of the holding pin and/or of the corresponding holding cutout, but can be removed again from the latter only with increased expenditure of force.

In the case of a cohesive connection, the first body can be connected to the second body by atomic and/or molecular forces. Cohesive connections can often be non-releasable connections. In various embodiments, a cohesive connection can be realized for example as an adhesively bonded connection, a solder connection, for example of a glass solder or of a metal solder, or as a molded connection.

The electromagnetic radiation source can have for example at one side a flat, active surface, at which it emits the electromagnetic radiation during operation. The electromagnetic radiation source can be for example a surface emitter and/or a lambertian emitter. An emission characteristic of the lambertian emitter can be represented for example by a lambertian radiant intensity distribution.

In various embodiments, an electromagnetic radiation source 102 has an optically active region 104. The electromagnetic radiation source 102 is operable by an energy source 103, for example illustrated in FIG. 1A.

In various embodiments, infrared radiation (IR radiation) is generated by conversion. IR radiation can be generated by conversion of OLEDs which emit with shorter wavelength, e.g. green, yellow and red OLEDs. For local applications, an individual adaptation can be achieved by a conversion mask. In various embodiments, the combination of a (typically green, yellow or red) pump OLED with an individually adaptable conversion area is described. The conversion area can convert the light emitted by the OLED into infrared light having a longer wavelength.

In various embodiments, the electromagnetic radiation source 102 is an OLED which emits with shorter wavelength, in comparison with infrared radiation, for example a pump OLED, for example a pump OLED which emits light in the green, yellow or red wavelength range and converts this light into infrared light by an individually adaptable converter structure 106.

In various embodiments, the electromagnetic radiation source 102 has one or a plurality of light emitting diode(s), for example one or a plurality of organic light emitting diodes, for example one or a plurality of planar, organic light emitting diodes. Alternatively or additionally, the electromagnetic radiation source 102 can have one or a plurality of incandescent lamp(s), for example one or a plurality of halogen incandescent lamp(s); one or a plurality of fluorescent lamp(s).

In various embodiments, a planar emitting (red) LED or arrangement of LEDs can also be used instead of an OLED.

In various embodiments, the electromagnetic radiation source 102 has a first carrier. The first carrier may be deformable. The first carrier can be plastically or elastically deformable.

In various embodiments, the first carrier is embodied as flexible and/or pliable. The first carrier can be or comprise a flexible printed circuit board, for example.

One or a plurality of electromagnetic radiation sources 102 can be arranged on or above the elastic carrier. The one or the plurality of electromagnetic radiation source(s) 102 can be embodied identically or differently from one another.

In various embodiments, the carrier of the electromagnetic radiation source 102 is designed like the carrier 702 of the organic light emitting diode 700, which carrier is described in greater detail further below.

In various embodiments, the component-external region to be irradiated can have a movable region and/or an immobile region. The component-external region to be irradiated can be a surface of an organic tissue, for example skin. The component-external region to be irradiated can be a region to be subjected to therapeutic treatment and/or a region to be subjected to cosmetic treatment on the organic tissue, for example a birthmark, for example a wart. The component-external region to be irradiated can have an individual shape and individual dimensions; by way of example, the component-external region to be irradiated can have the shape of a circle having a diameter.

Figure 1B:
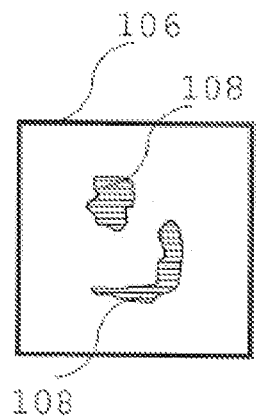
FIG. 1B shows a schematic illustration of a converter structure in accordance with various embodiments.

In various embodiments, a converter structure 106 has a predefined region 108, for example illustrated in FIG. 1B.

Furthermore, a converter structure 106 may include at least one converter material 114. The converter material 114 is designed to convert at least one portion of the first electromagnetic radiation into at least one second electromagnetic radiation.

Furthermore, the converter structure 106 can be formed in a structured fashion in such a way that the converter structure 106 has a predefined region 108, such that the at least one second electromagnetic radiation is emittable only from the predefined region 108, and the predefined region 108 has a smaller area than the optically active region 104.

In various embodiments, the converter structure 106 is formed in an areal fashion.

In various embodiments, the converter structure 106 is designed to be resistant to at least one solvent, for example isopropanol. By way of example, the converter structure 106 can be resistant to a solvent which can be used for disinfection or cleaning of the converter structure.

In various embodiments, the converter structure has a filter which is nontransmissive to at least one portion of the first electromagnetic radiation. By way of example, the filter can be designed to filter from the beam path a radiation that is harmful to the component-external region to be irradiated.

In various embodiments, the predefined region 108 has a plurality of regions or is formed by a continuous region.

The predefined region 108 can be formed in accordance with the component-external region to be irradiated.

The predefined region 108 can be formed in accordance with the shape and/or in accordance with at least one dimension of the component-external region to be irradiated. The predefined region 108 can be formed in such a way that it has the shape and the dimensions of the component-external region to be irradiated, such that the predefined region 108 is arrangeable congruently on the component-external region to be irradiated.

The converter structure 106 may include an adhesive for close connection to the component-external region to be irradiated. In various embodiments, the converter structure 106 may include a self-supporting, cohesive connection means for the close connection to the component-external region to be irradiated, for example a double-sided adhesive tape.

The adhesive for the close connection of the converter structure 106 to the component-external region to be irradiated can be formed in such a way that release of the connection of the converter structure 106 to the component-external region to be irradiated is possible. By way of example, the converter structure 106, like a medical sticking plaster, can be pulled off again from the component-external region to be irradiated, after having been adhesively attached thereto.

In various embodiments, the optoelectronic component 100, for irradiating the component-external region to be irradiated, is arranged on the component-external region to be irradiated. The converter structure 106, for irradiating the component-external region to be irradiated, can be brought into physical contact with the component-external region to be irradiated.

In various embodiments, the optoelectronic component 100 is arranged at a distance from the component-external region to be irradiated. The distance can have for example a length in a range of 1 mm to 30 cm.

In various embodiments, the converter structure 106 may include at least one structure for aligning the converter structure 106. The converter structure 106 is arranged on the component-external region to be irradiated. By the at least one structure for alignment, a user can position and align the converter structure 106 on the component-external region to be irradiated. By way of example, the user can arrange the predefined region 108 of the converter structure 106 on or above the component-external region to be irradiated. The user, by the structure for alignment, can arrange the predefined region 108 of the converter structure 106 congruently on the component-external region to be irradiated. As a result, it is possible for the user to irradiate only the component-external region to be irradiated with the at least one second electromagnetic radiation.

In various embodiments, the converter structure 106 may include a second protective structure, which is designed as a barrier with regard to a diffusion flow of one or a plurality of substances in and/or from the converter structure 106. The second protective structure is exposed.

In various embodiments, the second protective structure may include a film.

In various embodiments, the second protective structure may include or be a lacquer.

In various embodiments, the second protective structure may include or be a polymer.

In various embodiments, the second protective structure can be formed as a thin metal film.

In various embodiments, the second protective structure can be formed such that it is at least translucent with respect to the at least one second electromagnetic radiation.

The second protective structure can be formed such that it is resistant to at least one solvent, for example isopropanol. By way of example, the second protective structure can be resistant to a solvent which can be used for disinfection or cleaning of the converter structure.

The second protective structure can be arranged reversibly on the converter structure 106 in such a way that the second protective structure can be removed from the converter structure 106. Furthermore, for example, a new second protective structure can be arranged, for example closely fixed, on the converter structure 106. By an exchangeable second protective structure, a possible unhygienic contamination between different patients can be prevented. By way of example, the second protective structure can be reversibly connected by a holding device for reversibly connecting the second protective structure to the converter structure 106. The holding device for reversibly connecting the second protective structure to the converter structure 106 can be formed like the holding device 110, wherein the holding device 110 is described more thoroughly further below.

Figure 1C:
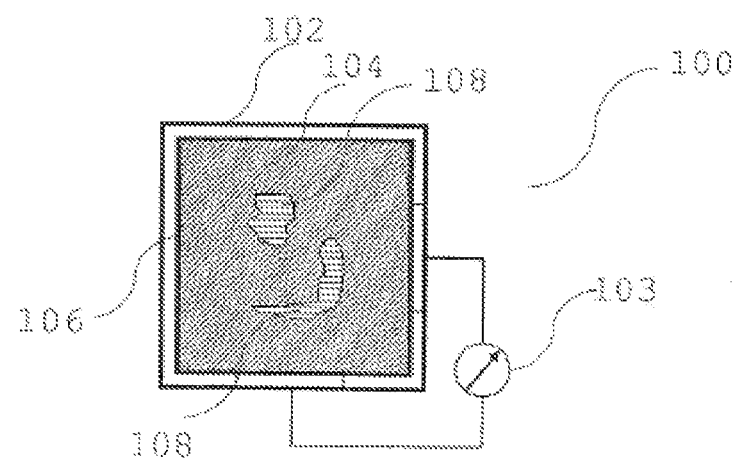
FIG. 1C shows a schematic illustration of an optoelectronic component in accordance with various embodiments.

In various embodiments, the converter structure 106 is arranged in the beam path of the first electromagnetic radiation, for example illustrated in FIG. 1C.

In various embodiments, the converter structure 106 and the electromagnetic radiation source 102 are in physical contact. The physical contact can bring about a mechanical abrasion of the regions that are in contact.

In various configurations, the electromagnetic radiation source 102 and/or the converter structure 106 have/has a first protective structure. The first protective structure is designed in such a way that a mechanical abrasion of that side of the electromagnetic radiation source 102 which faces the converter structure 106 is reducible, or that a mechanical abrasion of that side of the converter structure 106 which faces the electromagnetic radiation source 102 is reducible.

In the case of physical contact between the electromagnetic radiation source 102 (the converter structure 106) and the converter structure 106 (the electromagnetic radiation source 102), wear can occur on that surface of the electromagnetic radiation source 102 (of the converter structure 106) which faces the converter structure 106 (the electromagnetic radiation source 102). The first protective structure can be formed in such a way that said wear is reduced. The first protective structure includes or is formed by a film or a lacquer or a polymer, for example.

In various embodiments, the first protective structure is formed such that it is at least translucent with respect to the first electromagnetic radiation.

The first protective structure can be arranged reversibly on the electromagnetic radiation source 102 and/or the converter structure 106 in such a way that the first protective structure can be removed from the electromagnetic radiation source 102 and/or the converter structure 106. Furthermore, by way of example, a new first protective structure can be arranged, for example closely fixed, on the electromagnetic radiation source 102 and/or the converter structure 106. By an exchangeable first protective structure, a possible unhygienic contamination between different patients can be prevented. By way of example, the first protective structure can be reversibly connected by a holding device for reversibly connecting the first protective structure to the converter structure 106 and/or the electromagnetic radiation source 102. The holding device for reversibly connecting the first protective structure to the converter structure 106 and/or the electromagnetic radiation source 102 can be formed like the holding device 110, wherein the holding device 110 is described more thoroughly further below.

In various embodiments, the optoelectronic component 100 includes a holding device 110, for example illustrated in FIG. 2.

The holding device is designed for holding the converter structure 106 in the beam path of the electromagnetic radiation source 102.

In various embodiments, the holding device 110 is designed in such a way that the optoelectronic component 100 has an air gap between electromagnetic radiation source 102 and converter structure 106. The air gap can be designed in such a way that the mechanical abrasion between electromagnetic radiation source 102 and converter structure 106 is reducible and dissipation of heat from the optoelectronic component 100 is facilitated, where dissipation of heat from the optoelectronic component 100 can be understood to mean emission of heat produced as a result of the operation of the optoelectronic component 100 from the component into an external region.

In various embodiments, the holding device 110 is designed in such a way that the electromagnetic radiation source 102 and the converter structure 106 are in physical contact with one another.

The holding device 110 may include or be a cohesive connection means, for example an adhesive. Furthermore, the holding device 110 may include or be a self-supporting, cohesive connection means, for example a double-sided adhesive tape.

In various embodiments, the holding device 110 includes a positively locking connection structure, for example a plug connection. By way of example, a positively locking connection can also be configured by the electromagnetic radiation source 102 and the converter structure 106 being stacked one above the other.

In various embodiments, the holding device 110 includes a force-locking connection structure, for example for magnetically connecting the electromagnetic radiation source 102 and the converter structure 106. By way of example, the force-locking connection structure can be configured by lateral clips.

In various embodiments, the holding device 110 may include a magnetic connection device. The magnetic connection device can be designed in such a way that at least one first magnet is closely connected to the electromagnetic radiation source 102 and at least one second magnet is closely connected to the converter structure 106, such that the electromagnetic radiation source 102 and the converter structure 106 are connectable by a magnetic connection, for example by a magnetic frame.

In various embodiments, the holding device 110 is designed for reversibly connecting the electromagnetic radiation source 102 to the converter structure 106. The converter structure 106 and/or the electromagnetic radiation source 102 can be connectable again and operable again after release of the connection.

In various embodiments, a reversible connection is configured in such a way that the connection of the electromagnetic radiation source 102 to the converter structure 106 is releasable at least partly nondestructively. Nondestructive release can be defined by the fact that a first force is less than a second force. The first force is necessary for releasing the connection of the holding device 110 to the electromagnetic radiation source 102 and/or the converter structure 106. The second force damages the electromagnetic radiation source 102 and/or the converter structure 106 with regard to the function thereof. Damage to the electromagnetic radiation source 102 and/or the converter structure 106 with regard to the function thereof includes an impairment of at least one optical and/or electrical property of the electromagnetic radiation source 102 and/or of the converter structure 106.

Alternatively, after release of the connection of the electromagnetic radiation source 102 to the converter structure 106, for example also designated as opening of the holding device 110, in the case of a defect of the electromagnetic radiation source 102 and/or of the converter structure 106, the defective electromagnetic radiation source 102 and/or the defective converter structure 106 can be exchanged for an intact electromagnetic radiation source 102 and/or an intact converter structure 106 in such a way that the optoelectronic component 100 is operable again.

In the case of a defect of the holding device 110, the latter can be exchanged in such a way that the electromagnetic radiation source 102 and the converter structure 106 are connectable again, for example connectable again by an intact holding device 110.

A reversible cohesive connection of the electromagnetic radiation source 102 to the converter structure 106 can be configured in such a way that, for example, residues of adhesive that are situated on the electromagnetic radiation source 102 and/or the converter structure 106 can be removed before the electromagnetic radiation source 102 and the converter structure 106 are connected again by the holding device 110. If the holding device 110 is formed as a double-sided adhesive tape, for example, residues of the adhesive of the adhesive tape can remain stuck on the electromagnetic radiation source 102 and the converter structure 106 after the release of the connection. Said residues can then subsequently be removed from the radiation source 102 and the converter structure 106 without damage to the electromagnetic radiation source 102 and the converter structure 106, for example by a solvent.

In various embodiments, the converter structure 106 includes a matrix 116 on or above the electromagnetic radiation source 102. The converter material 114 can be distributed in a structured fashion on the matrix 116. The regions with converter material 114 define the predefined region 108, for example illustrated in FIG. 3A; by way of example, the converter structure 106 can furthermore include a reflective layer 120, for example illustrated in FIG. 5A and described more thoroughly below.

The matrix 116 can be formed such that it is at least translucent with respect to the first electromagnetic radiation and/or with respect to the at least one second electromagnetic radiation.

The matrix 116 may include a polymer or be a polymer. The matrix 116 may include a lacquer or be a lacquer.

The matrix 116 may include a film or be a film. The matrix 116 can be formed as a self-adhesive film in such a way that an area of the film is areally coated with an adhesive, such that the film is connectable to the electromagnetic radiation source 102 by the adhesive.

In various embodiments, the matrix 116 is plastically or elastically deformable.

Furthermore, the converter material 114 can be formed as a paste for cohesive connection, for example as an adhesive, for example also designated as adhesive paste. The converter film adheres to the electromagnetic radiation source 102, for example to an OLED, only at the locations with converter. In this regard, less waste heat can pass to regions outside the component-external region to be irradiated, for example to locations of an organic tissue that are not to be treated.

In various embodiments, the converter material 114 is distributed in a structured fashion in the matrix 116, where in the regions with converter material 114 define the predefined region 108, for example illustrated in FIG. 3B; by way of example, the converter structure 106 may furthermore include a reflective layer 120, for example illustrated in FIG. 5B and described more thoroughly below.

In various embodiments, the converter material 114 is distributed in a structured fashion on the electromagnetic radiation source 102. The regions with converter material 114 define the predefined region 108, for example illustrated in FIG. 3C; by way of example, the converter structure 106 may furthermore include a reflective layer 120, for example illustrated in FIG. 5C and described more thoroughly below.

In various embodiments, the converter material 114 is distributed in a structured fashion in the matrix 116. The regions with converter material 114 define the predefined region 108. The converter structure 106 includes particles 118 embedded into the matrix 116, for example illustrated in FIG. 3D; by way of example, the converter structure 106 may furthermore include a reflective layer 120, for example illustrated in FIG. 5D and described more thoroughly below.

In various embodiments, the particles 118 are distributed homogeneously in the matrix 116.

In various embodiments, the particles 118, for example also designated as scattering particles 118, are designed to be scattering for the first electromagnetic radiation and/or the at least one second electromagnetic radiation.

In various embodiments, the first electromagnetic radiation emitted by the electromagnetic radiation source 102 is a directional radiation. In various embodiments, the converter structure 106 is formed in such a way that the directional first electromagnetic radiation is converted into lambertian radiation by the particles 118.

In various embodiments, the converter structure 106 is designed as a structure for scattering electromagnetic radiation, for example as a scattering film, for example as an external coupling-out film. Consequently, the coupling-out efficiency of at least one portion of the first electromagnetic radiation and/or of at least one portion of one second electromagnetic radiation can be increased by the scattering particles 118.

In various embodiments, the converter material 114 is distributed in a structured fashion on the matrix 116, wherein the regions with converter material 114 define the predefined region 108. The converter structure 106 includes particles 118 embedded into the matrix 116, for example illustrated in FIG. 3E; by way of example, the converter structure 106 may furthermore include a reflective layer 120, for example illustrated in FIG. 5A and described more thoroughly below.

In various embodiments, the converter structure 106 has a mask 115, for example illustrated in FIG. 4A to FIG. 4D.

In various embodiments, the mask 115 has a first region and a second region. The first region is transmissive to at least one portion of the at least one second electromagnetic radiation. The second region is nontransmissive to at least one portion of the at least one second electromagnetic radiation, such that the first region defines the predefined region 108.

In various embodiments, the mask 115 is arranged on or above the electromagnetic radiation source 102 in such a way that a component-external region to be irradiated is irradiated with the at least one second electromagnetic radiation only through the first region of the mask 115.

The mask 115 may include a metal or be a metal. Furthermore, the mask 115 can be formed as a thin metal film. The metal can be formed in such a way that it is nontransmissive to at least one portion of the at least one second electromagnetic radiation.

The mask 115 can be formed as a film. The film can be formed in such a way that it is nontransmissive to at least one portion of the at least one second electromagnetic radiation.

The mask 115 may include a polymer or be a polymer. The polymer can be formed in such a way that it is nontransmissive to at least one portion of the at least one second electromagnetic radiation.

In various embodiments, a mask 115 is a continuous structure having at least one opening, for example a film or a metal plate having at least one opening, for example a diaphragm structure, for example a diaphragm. The at least one opening has a defined shape and defined dimensions and wherein the film and/or the metal plate are/is nontransmissive to at least one portion of the at least one second electromagnetic radiation. Furthermore, a mask 115 can be for example a piece of a film or of a metal which has no openings, for example a continuous piece of a film or of a metal which is nontransmissive to at least one portion of the at least one second electromagnetic radiation.

Figure 4A:
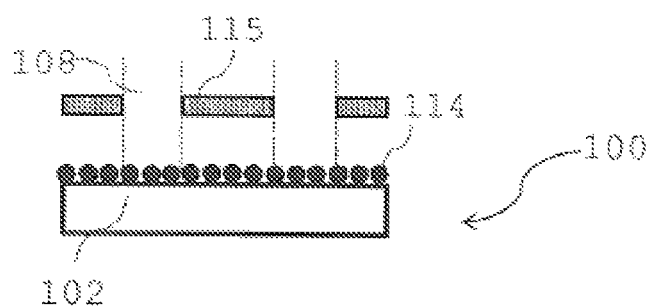
FIGS. 4A to 4C show schematic illustrations of various embodiments of an optoelectronic component.
Figure 4B:
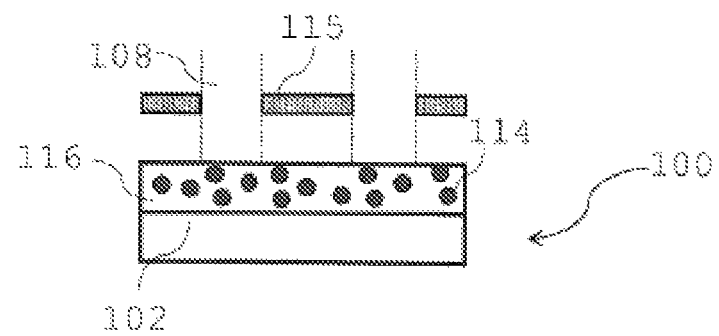
Figure 4C:
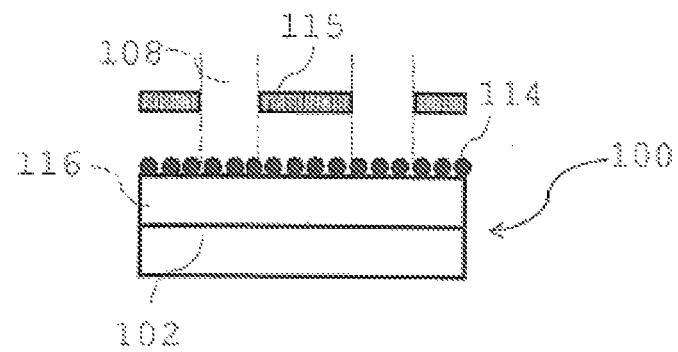

In various embodiments, the converter material 114 is distributed homogeneously on or above the electromagnetic radiation source 102 and the mask 115 is arranged on or above the converter material 114, for example illustrated in FIG. 4A.

In various embodiments, the converter material 114 is distributed homogeneously in the matrix 116. The matrix 116 is arranged on or above the electromagnetic radiation source 102. The mask 115 is arranged on or above the converter material 114, for example illustrated in FIG. 4B.

In various embodiments, the converter material 114 is distributed homogeneously on the matrix 116. The matrix 116 is arranged on or above the electromagnetic radiation source 102. The mask 115 is arranged on or above the converter material 114, for example illustrated in FIG. 4C.

In various embodiments, the converter structure 106 includes a reflective layer 120, for example illustrated in FIG. 5A to FIG. 5E. It is possible to form the optoelectronic component 100 with reflective layer 120 as described above and as illustrated in FIG. 3A to FIG. 3E, for example. The reflective layer 120 can be arranged in regions which are free of converter material 114.

In various embodiments, the reflective layer 120 is formed in such a way that it reflects at least one portion of the first electromagnetic radiation. In various embodiments, the reflective layer 120 is arranged in the beam path of the first electromagnetic radiation in such a way that at least one portion of the first electromagnetic radiation which is not converted into the at least one second electromagnetic radiation by the converter material 114 is reflected by the reflective layer 120. The reflective layer 120 can be arranged on or above the electromagnetic radiation source 102, and the reflective layer 120 can be arranged on or in the matrix 116. The reflective layer 120 is arranged in regions which comprise no converter material 114. In other words, the reflective layer 120 is arranged outside the predefined region 108.

The reflective layer 120 can be arranged on non-converting regions of the converter structure 106 in order to prevent a coupling-out of at least one portion of the first electromagnetic radiation, for example of the light of shorter wavelength from the pump OLED, and to increase the conversion efficiency.

In various embodiments, by only partially applying the converter material 114, what is achieved is that the second electromagnetic radiation, for example IR light, is emitted only at the desired locations. At the locations without converter, in the simplest case, the first electromagnetic radiation, for example the light of shorter wavelength from the pump OLED, is emitted. In various embodiments, only the at least one second electromagnetic radiation, for example the IR light, is desired for the application. It may therefore be advantageous to suppress the coupling-out of the first electromagnetic radiation, for example of the light of shorter wavelength. Moreover, it may be advantageous for that first electromagnetic radiation which would otherwise leave the converter structure 106 without being converted, for example the light of said areas not covered with converter, likewise to be utilized for the conversion. For this purpose, the portion without converter can be covered with a reflective material, for example a silver or aluminum layer (Ag or Al layer) or an aluminum film (Al film). The light then propagates again through the electromagnetic radiation source 102, for example through the OLED, and can impinge on the converter after a plurality of reflections. This prevents the first electromagnetic radiation, for example the light of shorter wavelength from the pump OLED, from emerging. At the same time, moreover, the proportion of the radiation emitted by the pump OLED which is constituted by the converted electromagnetic radiation, for example the converted light, is increased.

In various embodiments, increasing the conversion efficiency by the reflective layer 120 is particularly effective if the reflective layer 120 is used in combination with the scattering particles 118 embedded in the matrix 116, for example also designated as a scattering layer, since then the reflected electromagnetic radiation, for example the reflected light, impinges on the conversion material on a shorter path and this results in a reduction of the absorption losses owing to renewed propagation of the electromagnetic radiation in the electromagnetic radiation source 102, for example the OLED. As a result of scattering centers being introduced between the electromagnetic radiation source 102, for example the OLED, and the reflective layer 120 (Al/Ag layer assembly or Al film), on average the distance covered by the electromagnetic radiation, for example the light, which originally leaves the electromagnetic radiation source 102, for example the OLED, at a location without converter until conversion is reduced, and the efficiency of the conversion of the first electromagnetic radiation, for example of the pump light, into the desired, local at least one second electromagnetic radiation, for example IR radiation, is thus increased further.

In various embodiments, the particles 118 are designed to be reflective in such a way that at least one portion of the first and/or of the second electromagnetic radiation is reflected by the particles 118. In various embodiments, the reflective layer 120 is formed by the reflective particles 118. By way of example, by the reflective layer 120 formed by the reflective particles 118, the conversion effect can be improved and the emission characteristic of the optoelectronic component can be homogenized.

In various embodiments, the converter material 114 is suitable for conversion into the IR. By way of example, materials that can be used for the conversion into the IR include, as in the case of the inorganic LEDs, inorganic phosphors; quantum dots; and/or organic dyes, for example IR laser dyes. Organic laser dyes generally have a high photoluminescence quantum efficiency and are very suited as conversion materials.

Figure 6:
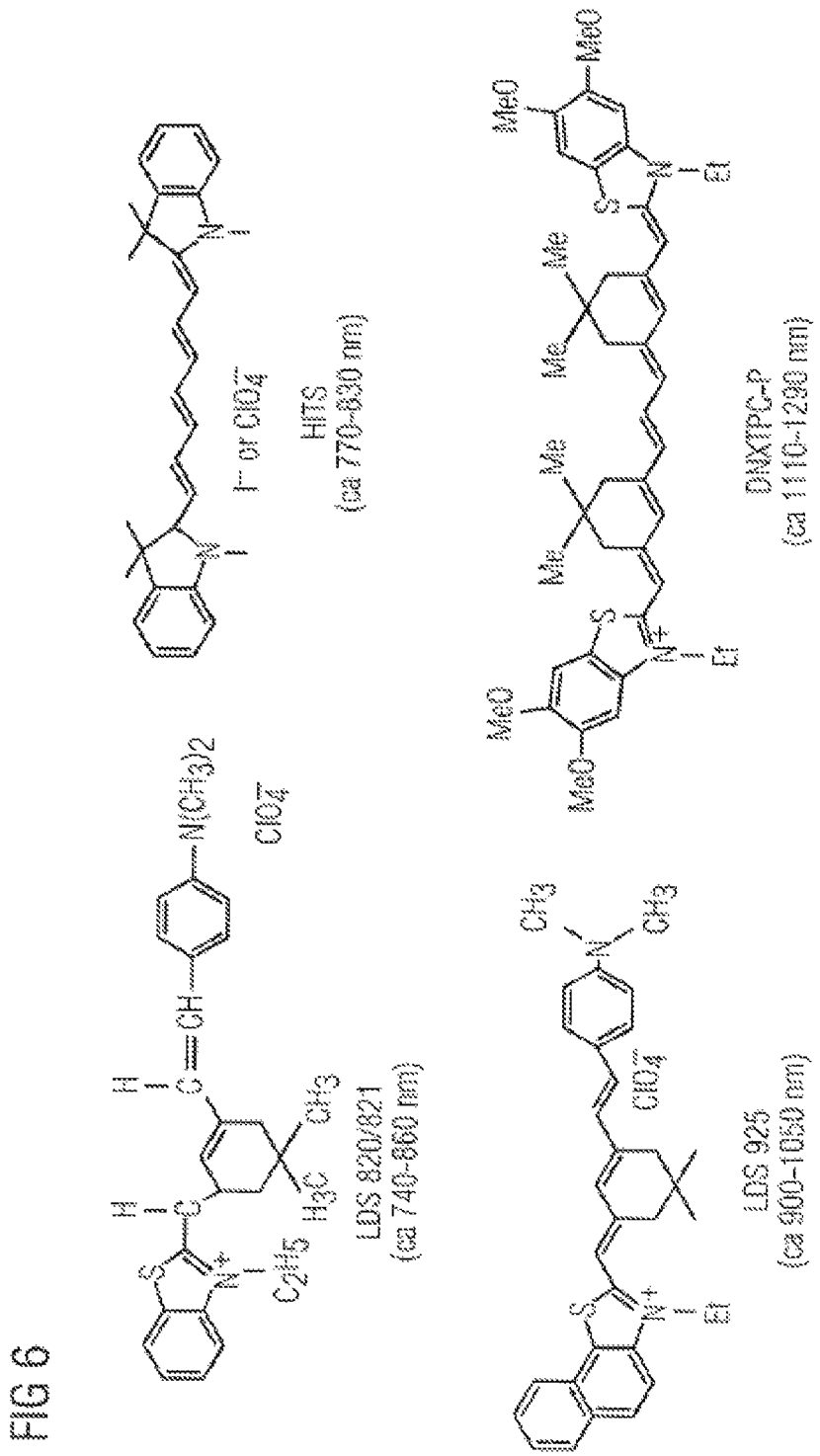
FIG. 6 shows chemical structural formulae of converter materials in accordance with various embodiments.

In various embodiments, the converter material 114 is configured in such a way that it includes at least one of the following IR laser dyes: LDS 820/821, HITS, LDS 925 and/or DNXTPC-P, for example illustrated as chemical structural formulae in FIG. 6.

In various embodiments, the electromagnetic radiation source 102 is designed in such a way that the wavelength range of the first electromagnetic radiation is in a wavelength range of visible light, for example in a wavelength range of approximately 380 nm to 780 nm, for example in a wavelength range of violet light (380 nm to 430 nm), for example in a wavelength range of blue light (430 nm to 490 nm), for example in a wavelength range of green light (490 nm to 570 nm), for example in a wavelength range of yellow light (570 nm to 600 nm), for example in a wavelength range of orange light (600 nm to 640 nm), for example in a wavelength range of red light (640 nm to 780 nm).

In various embodiments, the electromagnetic radiation source 102 is designed in such a way that the wavelength range of the first electromagnetic radiation is in a wavelength range of infrared radiation, for example in a wavelength range of approximately 780 nm to 1 mm, for example in a wavelength range of near infrared (780 nm to 3 µm), for example in a wavelength range of medium infrared (3 µm to 50 µm), for example in a wavelength range of far infrared (50 µm to 1 mm).

In various embodiments, the electromagnetic radiation source 102 is designed in such a way that the wavelength range of the first electromagnetic radiation is in a wavelength range of ultraviolet radiation, for example in a wavelength range of approximately 200 nm to 380 nm, for example in a wavelength range of far UV (200 nm to 280 nm), for example in a wavelength range of medium UV (280 nm to 315 nm), for example in a wavelength range of near UV (315 nm to 380 nm).

In various embodiments, the wavelength range of the at least one second electromagnetic radiation depends on the properties of the at least one converter material 114. The wavelength ranges of the first electromagnetic radiation can be dissimilar to the wavelength ranges of the at least one second electromagnetic radiation. By way of example, the wavelength range of the first electromagnetic radiation can be in a wavelength range of visible light, for example green, yellow, red light, while the wavelength range of the at least one second electromagnetic radiation can be in the range of infrared radiation.

In various embodiments, the converter material 114 is designed in such a way that the absorption range of the converter material 114 has the greatest possible correspondence to the emission range of the electromagnetic radiation source 102; by way of example, the highest possible conversion efficiency can thus be achieved.

In various embodiments, the converter material 114 is designed in such a way that the second electromagnetic radiation has a wavelength which is effective for therapeutic methods and/or for cosmetic methods, for example for heat therapy, for example for thermotherapy, for example for medical hyperthermia, for example for phototherapy, for example for color therapy, for example for the cosmetic and/or therapeutic treatment of tissue abnormalities, for example for the cosmetic and/or therapeutic removal of warts, for example for the treatment of diseased organic tissue, for example of diseased organic tissue on skin.

In various embodiments, the converter material 114 is designed in such a way that the wavelength range of the at least one second electromagnetic radiation is in a wavelength range of visible light, for example in a wavelength range of approximately 380 nm to 780 nm, for example in a wavelength range of violet light (380 nm to 430 nm), for example in a wavelength range of blue light (430 nm to 490 nm), for example in a wavelength range of green light (490 nm to 570 nm), for example in a wavelength range of yellow light (570 nm to 600 nm), for example in a wavelength range of orange light (600 nm to 640 nm), for example in a wavelength range of red light (640 nm to 780 nm).

In various embodiments, the converter material 114 is designed in such a way that the wavelength range of the at least one second electromagnetic radiation is in a wavelength range of infrared radiation, for example in a wavelength range of approximately 780 nm to 1 mm, for example in a wavelength range of near infrared (780 nm to 3 µm), for example in a wavelength range of medium infrared (3 µm to 50 µm), for example in a wavelength range of far infrared (50 µm to 1 mm).

In various embodiments, the converter material 114 is designed in such a way that the wavelength range of the at least one second electromagnetic radiation is in a wavelength range of ultraviolet radiation, for example in a wavelength range of approximately 200 nm to 380 nm, for example in a wavelength range of far UV (200 nm to 280 nm), for example in a wavelength range of medium UV (280 nm to 315 nm), for example in a wavelength range of near UV (315 nm to 380 nm).

Figure 7:
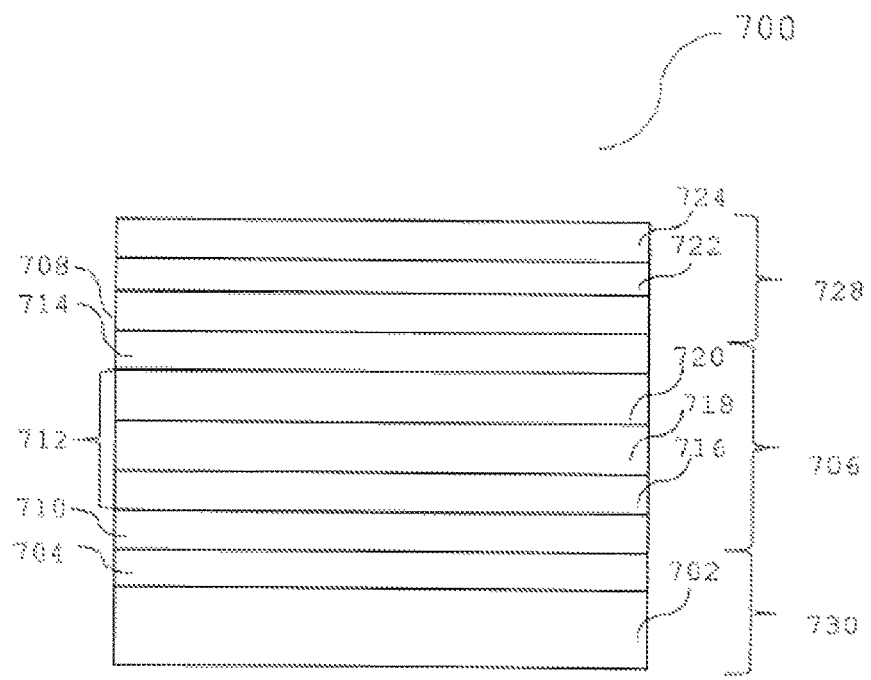
FIG. 7 shows a schematic cross-sectional view of an optoelectronic component in accordance with various embodiments.

FIG. 7 shows a schematic cross-sectional view of an electromagnetic radiation source 102 in accordance with various embodiments.

The electromagnetic radiation source 102 can be formed as an organic light emitting diode 700.

The organic light emitting diode 700 may include a hermetically impermeable substrate 730, an active region 706 and an encapsulation structure 728.

The hermetically impermeable substrate may include a carrier 702 and a first bather layer 704.

The active region 706 is an electrically active region 706 and/or an optically active region 706. The active region 706 is for example that region of the organic light emitting diode 700 in which electric current for operation of the organic light emitting diode 700 flows and/or in which electromagnetic radiation is generated and/or absorbed.

The electrically active region 706 may include a first electrode 710, an organic functional layer structure 712 and a second electrode 714.

The organic functional layer structure 712 may include one, two or more functional layer structure units and one, two or more intermediate layer structure(s) between the layer structure units. The organic functional layer structure 712 may include for example a first organic functional layer structure unit 716, an intermediate layer structure 718, and a second organic functional layer structure unit 720.

The encapsulation structure 728 may include a second barrier layer 708, a close connection layer 722 and a cover 724.

The carrier 702 may include or be formed from glass, quartz, and/or a semiconductor material. Furthermore, the carrier may include or be formed from a plastic film or a laminate including one or including a plurality of plastic films.

The carrier 702 may include or be formed from a metal, for example copper, silver, gold, platinum, iron, for example a metal compound, for example steel.

The carrier 702 can be embodied as opaque, translucent or even transparent.

The carrier 702 can be a part of a mirror structure or form the latter.

The carrier 702 may include a mechanically rigid region and/or a mechanically flexible region or be formed in this way, for example as a film.

The first bather layer 704 may include or be formed from one of the following materials: aluminum oxide, zinc oxide, zirconium oxide, titanium oxide, hafnium oxide, tantalum oxide, lanthanum oxide, silicon oxide, silicon nitride, silicon carbide, silicon oxynitride, indium tin oxide, indium zinc oxide, aluminum-doped zinc oxide, poly(p-phenylene terephthalamide), nylon 66, and mixtures and alloys thereof.

The first barrier layer 704 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

The first bather layer 704 may include one or a plurality of high refractive index materials, for example one or a plurality of material(s) having a high refractive index, for example having a refractive index of at least 2.

Furthermore, it should be pointed out that, in various embodiments, a first bather layer 704 can also be completely dispensed with, for example for the case where the carrier 702 is embodied as hermetically impermeable, for example includes or is formed from glass, metal, metal oxide.

The first electrode 710 can be formed as an anode or as a cathode.

The first electrode 710 may include or be formed from one of the following electrically conductive materials: a metal; a transparent conductive oxide (TCO); a network composed of metallic nanowires and nanoparticles, for example composed of Ag, which are combined for example with conductive polymers; a network composed of carbon nanotubes which are combined for example with conductive polymers; graphene particles and graphene layers; a network composed of semiconducting nanowires; an electrically conductive polymer; a transition metal oxide; and/or the composites thereof. The first electrode 710 composed of a metal or including a metal may include or be formed from one of the following materials: Ag, Pt, Au, Mg, Al, Ba, In, Ca, Sm or Li, and compounds, combinations or alloys of these materials. The first electrode 710 may include as transparent conductive oxide one of the following materials: for example metal oxides, for example zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped, or hole-conducting (p-TCO) or electron-conducting (n-TCO).

The first electrode 710 may include a layer or a layer stack including a plurality of layers of the same material or of different materials. The first electrode 710 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

The first electrode 710 can have for example a layer thickness in a range of 10 nm to 500 nm, for example of less than 25 nm to 250 nm, for example of 50 nm to 100 nm.

The first electrode 710 can have a first electrical terminal, to which a first electrical potential can be applied. The first electrical potential can be provided by an energy source, for example a current source or a voltage source. Alternatively, the first electrical potential can be applied to an electrically conductive carrier 702 and be electrically fed indirectly to the first electrode 710 through the carrier 702. The first electrical potential can be, for example, the ground potential or some other predefined reference potential.

FIG. 7 illustrates an organic light emitting diode 700 including a first organic functional layer structure unit 716 and a second organic functional layer structure unit 720. In various embodiments, the organic functional layer structure 712 may, however, also include more than two organic functional layer structures, for example 3, 4, 5, 6, 7, 8, 9, 10, or even more, for example 15 or more, for example 70.

The first organic functional layer structure unit 716 and the optional further organic functional layer structures may be formed identically or differently, for example include an identical or different emitter material. The second organic functional layer structure unit 720 or the further organic functional layer structure units can be embodied like one of the below-described embodiments of the first organic functional layer structure unit 716.

The first organic functional layer structure unit 716 may include a hole injection layer, a hole transport layer, an emitter layer, an electron transport layer and an electron injection layer.

In the case of an organic functional layer structure 712 including two or more organic functional layer structure units 716, 720, the second organic functional layer structure unit 720 can be formed above or alongside the first functional layer structure units 716. An intermediate layer structure 718 can be formed electrically between the organic functional layer structure units 716, 720.

In various embodiments, the intermediate layer structure 718 can be formed as an intermediate electrode 718, for example in accordance with one of the embodiments of the first electrode 710. An intermediate electrode 718 can be electrically connected to an external voltage source. The external voltage source can provide a third electrical potential, for example, at the intermediate electrode 718. However, the intermediate electrode 718 can also have no external electrical connection, for example by virtue of the intermediate electrode having a floating electrical potential.

In various embodiments, the intermediate layer structure 718 can be formed as a charge generation layer (CGL) structure 718. A charge generation layer structure 718 may include one or a plurality of electron-conducting charge generation layer(s) and one or a plurality of hole-conducting charge generation layer(s). The electron-conducting charge generation layer(s) and the hole-conducting charge generation layer(s) can be formed in each case from an intrinsically conducting substance or a dopant in a matrix 116. With regard to the energy levels of the electron-conducting charge generation layer(s) and of the hole-conducting charge generation layer(s), the charge generation layer structure 718 should be formed in such a way that electron and hole can be separated at the interface between an electron-conducting charge generation layer and a hole-conducting charge generation layer. The charge generation layer structure 718 may furthermore include a diffusion bather between adjacent layers.

The second electrode 714 can be formed on or above the organic functional layer structure 712 or, if appropriate, on or above the one or the plurality of further instances of the organic functional layer structure and/or organic functional layers.

The second electrode 714 can be formed in accordance with one of the embodiments of the first electrode 710, wherein the first electrode 710 and the second electrode 714 can be formed identically or differently. The second electrode 714 can be formed as an anode, that is to say as a hole-injecting electrode, or as a cathode, that is to say as an electron-injecting electrode.

The second electrode 714 can have a second electrical terminal, to which a second electrical potential can be applied. The second electrical potential can be provided by the same energy source as, or a different energy source than, the first electrical potential and/or the optional third electrical potential. The second electrical potential can be different than the first electrical potential and/or the optional third electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The second bather layer 708 can be formed on the second electrode 714.

The second bather layer 708 can also be designated as thin film encapsulation (TFE). The second bather layer 708 can be formed in accordance with one of the embodiments of the first barrier layer 704.

Furthermore, it should be pointed out that, in various embodiments, a second bather layer 708 may also be completely dispensed with. In such a configuration, the organic light emitting diode 700 may include a further encapsulation structure, for example, as a result of which a second bather layer 708 can become optional, for example a cover 724, for example a cavity glass encapsulation or metallic encapsulation.

Furthermore, in various embodiments, in addition one or a plurality of coupling-in/-out layers can also be formed in the organic light emitting diode 700, for example an external coupling-out film on or above the carrier 702 (not illustrated) or an internal coupling-out layer (not illustrated) in the layer cross section of the organic light emitting diode 700. The coupling-in/-out layer may include a matrix 116 and scattering centers distributed therein, wherein the average refractive index of the coupling-in/-out layer is greater or less than the average refractive index of the layer from which the electromagnetic radiation is provided. Furthermore, in various embodiments, in addition one or a plurality of antireflective layers (for example combined with the second bather layer 708) can be provided in the organic light emitting diode 700.

In various embodiments, a close connection layer 722, for example composed of an adhesive or a lacquer, can be provided on or above the second bather layer 708. By the close connection layer 722, a cover 724 can be closely connected, for example adhesively bonded, on the second bather layer 708.

The close connection layer 702 can be formed in such a way that the refractive index of the close connection layer 722 has a value similar, for example in a range of 10% to 15%, to that of the refractive index of the carrier 702 and/or a value similar to that of the refractive index of the converter structure 106, for example between 1.5 and 2.0.

A cover 724 can be formed on or above the close connection layer 722. The cover 724 can be closely connected to the electrically active region 706 by the close connection layer 722 and can protect said electrically active region against harmful substances. The cover 724 can be for example a glass cover 724, a metal film cover 724 or a sealed plastic film cover 724. The glass cover 724 can be closely connected for example by frit bonding (glass frit bonding/glass soldering/seal glass bonding) to the second barrier layer 708 or the electrically active region 706 by a conventional glass solder in the geometrical edge regions of the organic light emitting diode 700.

The cover 724 and/or the close connection layer 722 can have a refractive index (for example at a wavelength of 633 nm) of 1.55.

In various embodiments, the carrier of the converter structure 106 is formed in accordance with one of the configurations of the carrier 702 of the electromagnetic radiation source 102.

In various embodiments, the optoelectronic component 100 includes a flexible electromagnetic radiation source 102 and a flexible converter structure 106, for example a flexible OLED. The irradiation can be performed simultaneously at uneven skin regions and at a plurality of adjacent skin regions.

In various embodiments, the irradiation device is designed as a mobile device, e.g. as an armband. In this case, the energization is effected by a rechargeable battery; the conversion layer is fitted above the (flexible) OLED. The irradiation can be performed spatially independently over a relatively long period of time.

In various embodiments, the electromagnetic radiation source 102 is designed as a ring-shaped structure, for example as an elastic ring-shaped structure, for example as an armband, for example illustrated in FIG. 8A.

Furthermore, the converter structure 106, as illustrated in FIG. 8A, can also be designed as a ring-shaped structure, for example as an elastic ring-shaped structure, for example as an armband. The converter structure 106 can be fixed on or above a component-external region to be irradiated, for example to an arm. In various embodiments, the electromagnetic radiation source 102 has a holding device 110, wherein the holding device 110 can be formed for example like a closure of a watchstrap. The converter structure 106 can be physically connected to the electromagnetic radiation source 102 by the holding device 110. In various embodiments, the electromagnetic radiation source 102 includes electronics. The electronics are designed for open-loop or closed-loop control of the electromagnetic radiation source 102.

In various embodiments, the converter structure 106 is formed as a film, for example as a self-adhesive film, in such a way that an area of the film is areally coated with an adhesive, such that the film is connectable to the electromagnetic radiation source 102 by the adhesive.

The converter material 114 can be formed in and/or on the self-adhesive film, analogously to the already existing scattering film, and can thus be adhesively attached to the electromagnetic radiation source 102, for example an OLED, and be pulled off again after use.

The converter film can be applied to the OLED in a structured fashion or can be formed in a structured fashion on or above the electromagnetic radiation source, for example an OLED. The skin location can be irradiated thereby with two different wavelength ranges, for example. The film can be cut off by a user, for example a physician or therapist, depending on the required size and can be applied to the electromagnetic radiation source 102, for example an OLED, by adhesive attachment. Rerelease is thus likewise possible.

In various embodiments, the optoelectronic component 100 is arranged on a carrier 124. The holding device 110 is connected to the carrier 124 by at least one joint 126. The holding device 110 is arranged on the carrier 124. The electromagnetic radiation source 102 is arranged on or above the carrier. The converter structure 106 is arranged on or above the electromagnetic radiation source 102, for example illustrated in FIG. 8B.

Furthermore, the carrier 124 may include the electronics required for open-loop or closed-loop control of the optoelectronic component 100.

In various embodiments, the holding device 110 is designed as a magnetic connection device 122, for example illustrated in FIG. 8C.

The magnetic connection device 122 can be formed as magnetic strips which are adhesively bonded on the converter structure 106 and the electromagnetic radiation source 102. The magnetic strips can be designed for reversible force-locking connection, as described above.

In various embodiments, a method 900 for producing an optoelectronic component 100 is provided; the method is illustrated for example in FIG. 9.

In various embodiments, the method 900 includes providing 901 an electromagnetic radiation source 102 having an optically active region 104. The optically active region 104 is designed for emitting a first electromagnetic radiation.

In various embodiments, an electromagnetic radiation source 102 is provided, for example in accordance with one of the configurations explained above.

In various embodiments, the method includes providing 902 a converter structure 106. The converter structure 106 includes at least one converter material 114 and is arranged in the beam path of the first electromagnetic radiation. Furthermore, the converter structure 106 can be formed in a structured fashion in such a way that the converter structure 106 has a predefined region 108, such that the at least one second electromagnetic radiation is emitted only from the predefined region 108. Furthermore, the predefined region 108 can have a smaller area than the optically active region 104.

In various embodiments, providing 902 the converter structure 106 includes forming 903 a predefined region on the converter structure 106.

In various embodiments, the predefined region 108 is formed in such a way that it has a plurality of regions or is formed by a continuous region.

In various embodiments, the predefined region 108 is formed in accordance with the component-external region to be irradiated.

In various embodiments, the predefined region 108 is formed in accordance with the shape and/or in accordance with at least one dimension of the component-external region to be irradiated.

In various embodiments, the predefined region 108 is formed in such a way that it includes a matrix 116. The matrix 116 can be formed in accordance with one of the embodiments described above.

In various embodiments, the matrix 116 is formed in such a way that it includes a lacquer or is a lacquer. The lacquer can be applied to the electromagnetic radiation source 102 by spin-coating and can subsequently be crosslinked, for example for the purpose of curing the lacquer by a thermal method and/or by electromagnetic radiation.

The matrix 116 can be formed such that it is plastically or elastically deformable. The matrix 116 can be formed such that it is flexible and/or pliable.

In various embodiments, the at least one converter material 114 is formed in accordance with one of the embodiments described above.

In various embodiments, the converter material 114 is distributed in a structured fashion in the matrix 116 in such a way that the regions with converter material 114 define the predefined region 108.

In various embodiments, the converter material 114 is distributed in a structured fashion on the electromagnetic radiation source 102 in such a way that the regions with converter material 114 define the predefined region 108.

In various embodiments, the converter material 114 is distributed in a structured fashion in the matrix 116 in such a way that the regions with converter material 114 define the predefined region 108, wherein the converter structure 106 includes particles 118 embedded in or on the matrix 116.

In various embodiments, the converter material 114 is applied to the converter structure 106 by at least one of the processes below and/or the converter material 114 is applied to the electromagnetic radiation source 102 by at least one of the processes below: screen printing, ink-jet printing, blade coating, spraying, photolithography.

In various embodiments, the predefined region 108 is formed in such a way that it includes particles 118, for example scattering particles 118.

In various embodiments, the converter material 114 is distributed in a structured fashion in the matrix 116 in such a way that the regions with converter material 114 define the predefined region 108. The converter structure 106 includes particles 118 embedded in the matrix 116.

The particles 118 can be homogeneously distributed, for example embedded, in and/or on the matrix 116.

In various embodiments, the predefined region 108 is formed in such a way that it has a mask 115. The mask 115 can be formed in accordance with one of the embodiments described above.

In various embodiments, a holding device 110 is provided, for example in accordance with one of the configurations explained above. The converter structure 106 can be arranged in the beam path of the electromagnetic radiation source 102 by the holding device 110.

Figure 10:
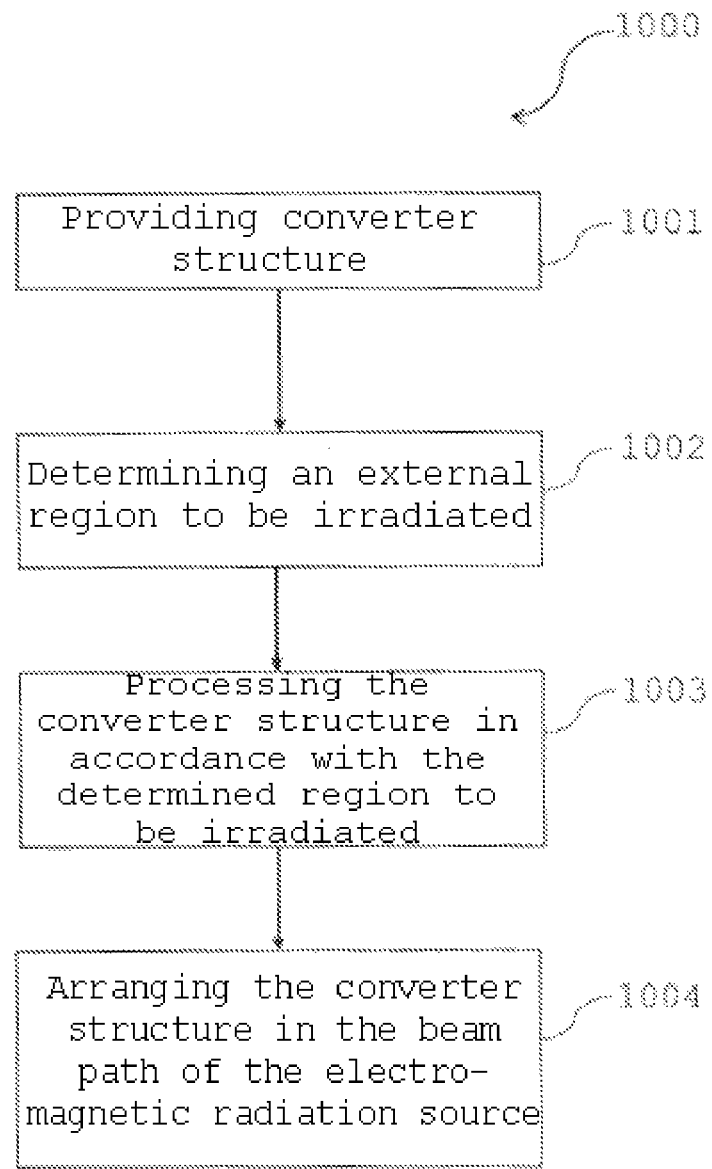
FIG. 10 shows a schematic illustration of a method for operating an optoelectronic component in accordance with various embodiments.

In various embodiments, a method for operating 1000 an optoelectronic component 100 in accordance with one of the configurations described is provided; the method is illustrated for example in FIG. 10.

In various embodiments, the method 1000 for operating an optoelectronic component 100 includes providing 1001 a converter structure 106 including at least one converter material 114.

In various embodiments, the method 1000 includes determining a component-external region to be irradiated.

In various embodiments, determining the component-external region to be irradiated includes determining the properties of the component-external region to be irradiated, for example its shape and its dimensions. By way of example, the shape and the dimensions of the component-external region to be irradiated can be determined by an optical measurement, for example by a scale, for example a ruler.

In various embodiments, the method 1000 includes processing 1003 the converter structure 106 in such a way that a predefined region 108 is formed in the converter structure 106 in accordance with the determined component-external region to be irradiated.

In various embodiments, processing 1003 the converter structure 106 in accordance with the determined component-external region to be irradiated includes forming the predefined region 108 in the converter structure 106, for example in such a way that the predefined region 108 has the shape and the dimensions of the component-external region to be irradiated. By way of example, the component-external region to be irradiated can have the shape of a circle having a diameter; accordingly, the method 1000 may include forming the circle having the diameter in the converter structure 106.

In various embodiments, the predefined region 108 is formed in accordance with the determined component-external region to be irradiated such that the component-external region includes a plurality of regions or is formed by a continuous region.

In various embodiments, forming the predefined region 108 in accordance with the determined component-external region to be irradiated includes distributing the converter material 114 on a matrix 116. The matrix 116 can be formed in accordance with one of the configurations explained above.

In various embodiments, the converter material 114 is distributed in a structured fashion in the matrix 116 in accordance with the determined component-external region to be irradiated in such a way that the regions with converter material 114 define the predefined region 108.

In various embodiments, the converter material 114 is distributed in a structured fashion on the electromagnetic radiation source 102 in accordance with the determined component-external region to be irradiated in such a way that the regions with converter material 114 define the predefined region 108.

In various embodiments, the converter material 114 is distributed in a structured fashion in the matrix 116 in accordance with the determined component-external region to be irradiated in such a way that the regions with converter material 114 define the predefined region 108. The converter structure 106 includes particles 118 embedded in or on the matrix 116.

In various embodiments, the converter material 114, in accordance with the determined component-external region to be irradiated, is applied to the converter structure 106 by at least one of the processes below and/or the converter material 114 is applied to the electromagnetic radiation source 102 by at least one of the processes below: screen printing, ink-jet printing, blade coating, spraying, photolithography.

In various embodiments, the converter material 114 is homogeneously distributed in or on the matrix 116. The matrix 116 is arranged on or above the electromagnetic radiation source 102. A mask 115 is arranged on or above the converter material 114. The mask 115 can be formed in accordance with one of the configurations explained above.

In various embodiments, the converter material 114 is homogeneously distributed on or above the electromagnetic radiation source 102 and the mask 115 is arranged on or above the converter material 114.

In various embodiments, the mask 115 can be formed in accordance with the determined component-external region to be irradiated.

In various embodiments, the mask 115 is arranged on or above the electromagnetic radiation source 102 in such a way that a component-external region to be irradiated is irradiated with the at least one second electromagnetic radiation only through the first region of the mask 115.

Furthermore, the method 1000 includes arranging 1004 the converter structure 106 in the beam path of an electromagnetic radiation source 102. The predefined region 108 has a smaller area than an optically active region 104 of the electromagnetic radiation source 102.

In various embodiments, a holding device 110 is provided, for example in accordance with one of the configurations explained above. The converter structure 106 can be arranged in the beam path of the electromagnetic radiation source 102 by the holding device 110.

In various embodiments, the method 1000 includes connecting the electromagnetic radiation source 102 to the converter structure 106 by a holding device 110.

In various embodiments, the method 1000 includes releasing the connection of the electromagnetic radiation source 102 to the converter structure 106 by the holding device 110.

In various embodiments, the optoelectronic component 100, for the purpose of irradiating the component-external region to be irradiated, is arranged on the component-external region to be irradiated; by way of example, for the purpose of irradiating the component-external region to be irradiated, the converter structure 106 can be brought into physical contact with the component-external region to be irradiated.

In various embodiments, the optoelectronic component 100 is arranged at a distance from the component-external region to be irradiated. The distance can have for example a length in a range of 1 mm to 30 cm.

The method 1000 may include arranging the predefined region 108 of the converter structure 106 on or above the component-external region to be irradiated. Arranging can be effected by the at least one structure for alignment.

The method 1000 may include connecting and/or releasing the connection of the second protective structure to the converter structure 106, for example by a holding device for reversibly connecting the second protective structure to the converter structure 106. The holding device for reversibly connecting the second protective structure to the converter structure 106 is described further above.

The method 1000 may include connecting and/or releasing the connection of the first protective structure to the converter structure 106 and/or the electromagnetic radiation source 102, for example by a holding device for reversibly connecting the first protective structure to the converter structure 106 and/or the electromagnetic radiation source 102. The holding device for reversibly connecting the first protective structure to the converter structure 106 and/or the electromagnetic radiation source 102 is described further above.

In various embodiments, an optoelectronic component, a method for producing an optoelectronic component and a method for operating an optoelectronic component are provided which make it possible to realize novel concepts of a localized and individually adapted irradiation of external regions with an electromagnetic radiation.

The structuring of a defined region of the converter structure, which region emits a desired wavelength of an electromagnetic radiation, affords the advantage that an individually adaptable irradiation can be made possible. Furthermore, the independence of conversion area and light source offers great potential savings since both parts can be exchanged independently of one another. This has the consequence that the pump OLED can be reused since it does not come directly into contact with the patient. Likewise, the OLED can be exchanged, independently of the conversion area, if the lifetime of the OLED is exceeded or a defect occurs. In the event of a defect of the OLED, only the latter is exchanged and, for a further patient, it is merely necessary to produce a new individual conversion layer. Alternatively, the IR conversion area can also be retained after the treatment for the patient and be used again in the next treatment. By exchanging the conversion mask, it is possible to change not only the pattern in the mask, but also the converter material. As a result, the irradiated area, the peak wavelength and the emission spectrum (spectrum of the IR radiation) can be varied. As a result of the independence of conversion area and light source, hygiene standards may also be complied with easily, since only the regions of the conversion area come into contact with the patient and costly disinfection is thus obviated.

In various embodiments, an optoelectronic component, a method for producing an optoelectronic component and a method for operating an optoelectronic component are provided which make it possible to realize novel concepts of a localized and individually adapted irradiation of component-external regions with an electromagnetic radiation.

In various embodiments, an optoelectronic component is provided, including an electromagnetic radiation source having an optically active region designed for emitting a first electromagnetic radiation. Furthermore, the optoelectronic component includes a converter structure, which includes at least one converter material and is arranged in the beam path of the first electromagnetic radiation. The at least one converter material is designed to convert at least one portion of the first electromagnetic radiation into at least one second electromagnetic radiation, wherein the at least one second electromagnetic radiation has at least one different wavelength than the at least one portion of the first electromagnetic radiation. Furthermore, the converter structure is formed in a structured fashion in such a way that the converter structure has a predefined region, such that the at least one second electromagnetic radiation is emittable only from the predefined region. The predefined region has a smaller area than the optically active region.

In various configurations, the optoelectronic component includes a holding device. The holding device can be designed for holding the converter structure in the beam path of the electromagnetic radiation source.

In various configurations, the holding device is designed in such a way that the electromagnetic radiation source and the converter structure are in physical contact with one another.

In various configurations, the holding device includes a cohesive connection means, for example an adhesive.

In various configurations, the holding device includes a self-supporting, cohesive connection means, for example a double-sided adhesive tape.

In various configurations, the holding device has a positively locking connection structure, for example for stacking the electromagnetic radiation source and the converter structure one above another.

In various configurations, the holding device has a force-locking connection structure, for example for magnetically connecting the electromagnetic radiation source and the converter structure.

In various configurations, the holding device has a magnetic connection device designed in such a way that at least one first magnet is closely connected to the electromagnetic radiation source and at least one second magnet is closely connected to the converter structure, such that the electromagnetic radiation source and the converter structure are connectable by a magnetic connection.

In various configurations, the electromagnetic radiation source and/or the converter structure can have a first protective structure, wherein the first protective structure is designed in such a way that mechanical abrasion of that side of the electromagnetic radiation source which faces the converter structure is reducible, or that mechanical abrasion of that side of the converter structure which faces the electromagnetic radiation source is reducible.

In various configurations, the electromagnetic radiation source has one or a plurality of light emitting diode(s), e.g. one or a plurality of organic light emitting diodes, e.g. one or a plurality of planar, organic light emitting diodes.

In various configurations, the converter structure has an adhesive for close connection to a component-external region to be irradiated.

In various configurations, the converter structure has at least one structure for aligning the converter structure. The converter structure can be arranged on the component-external region to be irradiated.

In various configurations, the converter material is distributed in a structured fashion on the electromagnetic radiation source, wherein the regions with converter material define the predefined region.

In various configurations, the converter structure includes particles. The particles can be distributed in or on a matrix, for example be embedded. In various configurations, the particles are designed to be scattering for at least one portion of the first electromagnetic radiation and/or at least one portion of the at least one second electromagnetic radiation.

In various configurations, the converter material is distributed in a structured fashion in or on a matrix, such that the regions with converter material define the predefined region.

In various configurations, the converter structure has a mask. The mask has a first region and a second region. The first region is transmissive to at least one portion of the second electromagnetic radiation. The second region is nontransmissive to at least one portion of the at least one second electromagnetic radiation. The mask can be arranged on or above the converter structure. The first region defines the predefined region.

In various configurations, the converter structure has a reflective layer. The reflective layer can be designed to reflect at least one portion of the first electromagnetic radiation. The reflective layer can be arranged on or above the electromagnetic radiation source. The regions in which the reflective layer is arranged are free of converter material. The reflective layer can be arranged on or above the matrix, wherein the regions in which the reflective layer is arranged are free of converter material.

In various configurations, the converter structure has a filter. The filter can be nontransmissive to at least one portion of the first electromagnetic radiation.

In various configurations, the converter structure has a second protective structure, which is designed as a barrier with regard to a diffusion flow of one or a plurality of substances in and/or from the converter structure. The second protective structure is exposed.

In various configurations, the predefined region has a plurality of regions or the predefined region is formed by a continuous region.

In various embodiments, a method for producing an optoelectronic component is provided. The method includes providing an electromagnetic radiation source having an optically active region designed for emitting a first electromagnetic radiation. Furthermore, the method includes providing a converter structure, which includes at least one converter material and is arranged in the beam path of the first electromagnetic radiation. The at least one converter material is designed to convert at least one portion of the first electromagnetic radiation into at least one second electromagnetic radiation. The at least one second electromagnetic radiation has at least one different wavelength than the at least one portion of the first electromagnetic radiation. Furthermore, the converter structure is formed in a structured fashion in such a way that the converter structure has a predefined region, such that the at least one second electromagnetic radiation is emitted only from the predefined region, and the predefined region has a smaller area than the optically active region.

In various embodiments, the method for producing the optoelectronic component may include features of the optoelectronic component; and the optoelectronic component may include features of the method for producing the optoelectronic component in such a way that and insofar as the features are applicable in an expedient fashion in each case.

In various embodiments, a method for operating an optoelectronic component is provided. The method includes providing a converter structure including at least one converter material. Furthermore, the method includes determining a component-external region to be irradiated, and processing the converter structure in such a way that a predefined region is formed in the converter structure in accordance with the determined component-external region to be irradiated. Furthermore, the method includes arranging the converter structure in the beam path of an electromagnetic radiation source. The predefined region has a smaller area than an optically active region of the electromagnetic radiation source.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An optoelectronic component for irradiating skin, the optoelectronic component being designed as an armband and comprising:
an electromagnetic radiation source having an organic light emitting diode comprising an optically active region designed for emitting a first electromagnetic radiation in the wavelength region of visible light towards the skin;
a converter structure, which comprises at least one converter material, which is arranged in a beam path of the first electromagnetic radiation, and which is formed as a film;
wherein the at least one converter material is designed to convert at least one portion of the first electromagnetic radiation into at least one second electromagnetic radiation in the wavelength range of infrared light;
wherein the at least one second electromagnetic radiation has at least one different wavelength than the at least one portion of the first electromagnetic radiation;
wherein the converter structure is formed in a structured fashion in such a way that the converter structure has a predefined region, such that the at least one second electromagnetic radiation is emittable only from the predefined region for irradiating the skin;
wherein the predefined region has a smaller area than the optically active region, and wherein the electromagnetic radiation source comprises a holding device for fixing the converter structure at an arm.

2. The optoelectronic component of claim 1, wherein the converter structure comprises particles distributed in or on a matrix.

3. The optoelectronic component of claim 2, wherein the particles are designed to be scattering for at least one of the first electromagnetic radiation or the at least one second electromagnetic radiation.

4. The optoelectronic component of claim 2, wherein the converter material is distributed in a structured fashion in or on the matrix in such a way that regions with converter material define the predefined region.

5. The optoelectronic component of claim 1, wherein the converter structure comprises a mask comprising a first region and a second region, wherein the first region is transmissive to at least one portion of the at least one second electromagnetic radiation, and wherein the second region is nontransmissive to at least one portion of the at least one second electromagnetic radiation, and wherein the mask is arranged on or above the converter structure in such a way that the first region defines the predefined region.

6. The optoelectronic component of claim 1, wherein the converter structure has a reflective layer, wherein the reflective layer is designed to reflect at least one portion of the first electromagnetic radiation, wherein the reflective layer is arranged on or above regions of the electromagnetic radiation source or a matrix which are free of converter material.

7. The optoelectronic component of claim 1, wherein the converter structure has a filter which is nontransmissive to at least one portion of the first electromagnetic radiation.

8. The optoelectronic component of claim 1, wherein the predefined region comprises a plurality of regions or is formed by a continuous region.

9. A method for producing an optoelectronic component as an armband for irradiating skin, the method comprising:
providing an organic light emitting diode having an optically active region designed for emitting a first electromagnetic radiation in a wavelength range of visible light towards skin;
providing a converter structure, which comprises at least one converter material, which is arranged in a beam path of the first electromagnetic radiation, and which is formed as a film;
wherein the at least one converter material is designed to convert at least one portion of the first electromagnetic radiation into at least one second electromagnetic radiation in a wavelength range of infrared light, wherein the at least one second electromagnetic radiation has at least one different wavelength than the at least one portion of the first electromagnetic radiation;

wherein the converter structure is formed in a structured fashion in such a way that the converter structure has a predefined region, such that the at least one second electromagnetic radiation is emitted only from the predefined region for irradiating the skin;

wherein the predefined region has a smaller area than the optically active region; and wherein the organic light emitting diode comprises a holding device for fixing the converter structure at an arm.

* * * * *